United States Patent
Tailliet

(10) Patent No.: US 8,741,742 B2
(45) Date of Patent: Jun. 3, 2014

(54) METHOD OF FABRICATING AN INTEGRATED CIRCUIT WITHOUT GROUND CONTACT PAD

(75) Inventor: François Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 49 days.

(21) Appl. No.: 13/492,504

(22) Filed: Jun. 8, 2012

(65) Prior Publication Data

US 2012/0313223 A1  Dec. 13, 2012

(30) Foreign Application Priority Data

Jun. 9, 2011  (FR) ...................................... 11 55050

(51) Int. Cl.
 *H01L 21/00* (2006.01)
 *H01L 21/66* (2006.01)
(52) U.S. Cl.
 CPC ..................................... *H01L 22/32* (2013.01)
 USPC .................. 438/462; 257/620; 257/E23.079; 257/E21.506; 257/E21.531; 438/15
(58) Field of Classification Search
 CPC ............................... H01L 22/32; H01L 22/34
 USPC ................... 257/620, 773, E23.01, E23.079, 257/E21.506, E21.531; 438/17, 462, 15
 See application file for complete search history.

(56) References Cited

U.S. PATENT DOCUMENTS

| | | | | |
|---|---|---|---|---|
| 5,047,711 | A | * | 9/1991 | Smith et al. ............... 324/750.06 |
| 5,539,325 | A | * | 7/1996 | Rostoker et al. ......... 324/750.05 |
| 5,739,546 | A | * | 4/1998 | Saitou et al. .................... 257/48 |
| 5,956,567 | A | * | 9/1999 | Tomita ............................ 438/18 |
| 6,299,463 | B1 | | 10/2001 | Akram |
| 6,562,647 | B2 | * | 5/2003 | Zandman et al. ............... 438/33 |
| 6,664,608 | B1 | | 12/2003 | Burr |
| 7,026,646 | B2 | * | 4/2006 | Cowles et al. .................. 257/48 |
| 2002/0020862 | A1 | | 2/2002 | Livengood et al. |
| 2003/0234393 | A1 | * | 12/2003 | Cowles et al. .................. 257/48 |
| 2007/0099312 | A1 | | 5/2007 | Pourkeramati et al. |
| 2008/0017856 | A1 | | 1/2008 | Fujino |
| 2009/0127553 | A1 | * | 5/2009 | Marie et al. ..................... 257/48 |

* cited by examiner

*Primary Examiner* — Allan R Wilson
(74) *Attorney, Agent, or Firm* — Seed IP Law Group PLLC

(57) ABSTRACT

The disclosure relates to a method of fabricating an integrated circuit of CMOS technology in a semiconductor wafer comprising scribe lines. According to the disclosure, a ground contact pad of the integrated circuit is made in a scribe line of the wafer and is destroyed during a step of individualizing the integrated circuit by singulation of the wafer. A ground contact of the integrated circuit is made on the back side of the integrated circuit when it is assembled in an interconnection package.

4 Claims, 4 Drawing Sheets

METHOD OF FABRICATING AN INTEGRATED CIRCUIT WITHOUT GROUND CONTACT PAD

BACKGROUND

1. Technical Field

The present disclosure relates to a method of fabricating an integrated circuit of CMOS technology in a semiconductor wafer comprising scribe lines.

2. Description of the Related Art

FIG. 1 shows a conventional method of fabricating an integrated circuit IC1. Integrated circuits IC1 are collectively made in a semiconductor wafer 20 comprising scribe lines 21, 22 separating each integrated circuit IC1. Integrated circuit IC1 comprises a semiconductor substrate 10, a circuit region 11 embedded in substrate 10, and contact pads P1, P2, P3, P4, P5. Circuit region 11, schematically shown by a dashed rectangle, comprises active components such as transistors, and may also comprise passive components such as resistors, diodes, etc. It also comprises conductors separated by layers of dielectric material. These conductors link different parts of circuit region 11 and also link the inputs or outputs of the circuit region to contact pads P1 to P5, which extend over the front side of the wafer, not within scribe lines 21, 22. Pad P5 is a ground contact pad electrically linked to substrate 10 and to circuit region 11.

Integrated circuit IC1 is then individualized by cutting the wafer 20 in the scribe lines 21, 22, in a process known as "singulation". The integrated circuit is then arranged in an interconnection package 30, as shown in FIG. 2. Package 30 comprises conductive leads 31 and a ground plane 32 on which the back side of integrated circuit IC1 is fixed, by the intermediary of a conductive material of the conductive glue or solder type. Contact pads P1 to P5 are then linked to conductive leads 31-1 to 31-5 of the package 30 by means of conductive wires W1 to W5. Leads 31 are destined to be soldered on an interconnection support, for example a printed circuit, lead 31-5 being linked to pad P5 and acting as a ground lead.

Such an integrated circuit is generally made using CMOS (Complementary Metal Oxide Semiconductor) technology, and circuit region 11 comprises NMOS transistors (N channel transistors) and PMOS transistors (P channel transistors). This technology allows substrate 10 to be electrically linked with a very low series resistance to circuit region 11, by the intermediary of internal connections in doped silicon. It is generally not necessary therefore to link the back side of the integrated circuit to ground pad P5 by means of an external connection, as it was the case with NMOS technology integrated circuits (a technology no longer in use). NMOS integrated circuits comprised a ground contact pad on their back side which needed to be linked to ground pad P5 by the exterior of the integrated circuit, so that substrate 10 could be brought to the same ground potential as circuit region 11. As shown in FIG. 2, a contact pad C1 was generally provided on ground plane 32 of the package, which was connected by means of a conductive wire W6 to lead 31-5. The back side of the integrated circuit was generally covered by a conductive layer, for example gold, to ensure a good electrical contact with ground plane 32.

In certain applications, integrated circuit IC1 is a very simple structure and circuit region 11 has a small surface area. In this case, the surface occupied by the different contact pads P1 to P5 on the front side of the integrated circuit may turn out to be as large as the surface area occupied by circuit region 11.

It may therefore be desired to reduce the surface area occupied by the contact pads, in order to reduce the overall size of the integrated circuit and to be able to make a greater number of integrated circuits IC1 on a given semiconductor wafer surface area.

Nevertheless, the surface area occupied by scribe lines 21, 22 cannot be reduced and is imposed by the singulation technique used (saw, laser, . . . ). Similarly, the surface area of contact pads P1 to P5 cannot be reduced and is imposed by the connection technique of pads P1 to P5 to the leads 31 of the package, in general a an ultrasonic solder wiring technique.

To reduce the surface area occupied by contact pads P1 to P5, the present disclosure is based on the observation that the ground pad P5 could be removed in a CMOS technology integrated circuit, and be replaced by a ground contact on the back side. Indeed, the weak series resistance between circuit region 11 and substrate 10 may allow the application of the ground potential to circuit region 11 by the intermediary of the back side of the integrated circuit, that is, by the intermediary of the substrate, to reach pad P5.

Nevertheless, ground pad P5 is used during a test phase of integrated circuit IC1, when it is still on wafer 20. This test phase conventionally uses a probe card applied to the front side of the wafer. Ground pad P5 is therefore used for the electrical test of the integrated circuit before the singulation of the wafer.

BRIEF SUMMARY

Thus, some embodiments of the disclosure relate to a method of fabricating an integrated circuit of CMOS technology in a semiconductor wafer comprising scribe lines, comprising steps of embedding a circuit region in a substrate, making, on the front side of the wafer, a ground contact pad of the integrated circuit that is electrically linked to the circuit region and to the substrate, wherein the ground contact pad of the integrated circuit is made in a scribe line of the wafer.

According to one embodiment, the surface area of the ground contact pad represents at least 5% of the surface area of a circuit region of the integrated circuit.

According to one embodiment, the method comprises a step of making other contact pads not within the scribe lines of the wafer.

According to one embodiment, the method comprises a step of testing the integrated circuit by means of a test machine, the testing step comprising the application of a test probe on the ground contact pad.

According to one embodiment, the method comprises a step of individualizing the integrated circuit by singulation of the wafer in the scribe lines, and of destroying the ground contact pad.

Some embodiments of the disclosure also relate to a method of fabricating an electronic device, comprising fabricating an integrated circuit according to the disclosure, and assembling the integrated circuit in a package comprising a ground plane and interconnection leads, such that the back side of the integrated circuit is in electrical contact with a ground interconnection lead of the package and replaces the ground contact pad destroyed during the individualization of the integrated circuit.

According to one embodiment, the ground interconnection lead forms a prolongation of the ground plane.

According to one embodiment, the method comprises electrically linking the ground interconnection lead to the ground plane of the package, by means of a conductive element.

Embodiments of the disclosure also relate to a semiconductor wafer comprising scribe lines and at least one integrated circuit of CMOS technology, the integrated circuit comprising a circuit region embedded in a substrate and a ground contact pad electrically linked to the circuit region and to the substrate, wherein the ground contact pad is arranged in a scribe line of the wafer and is destined to be destroyed during the individualization of the integrated circuit by singulation of the wafer.

According to one embodiment, the integrated circuit comprises other contact pads not arranged within the scribe lines.

BRIEF DESCRIPTION OF THE SEVERAL VIEWS OF THE DRAWINGS

Embodiments of the disclosure will now be described in a non limiting manner in relation with the appended drawings, among which.

DETAILED DESCRIPTION

Figure 3:
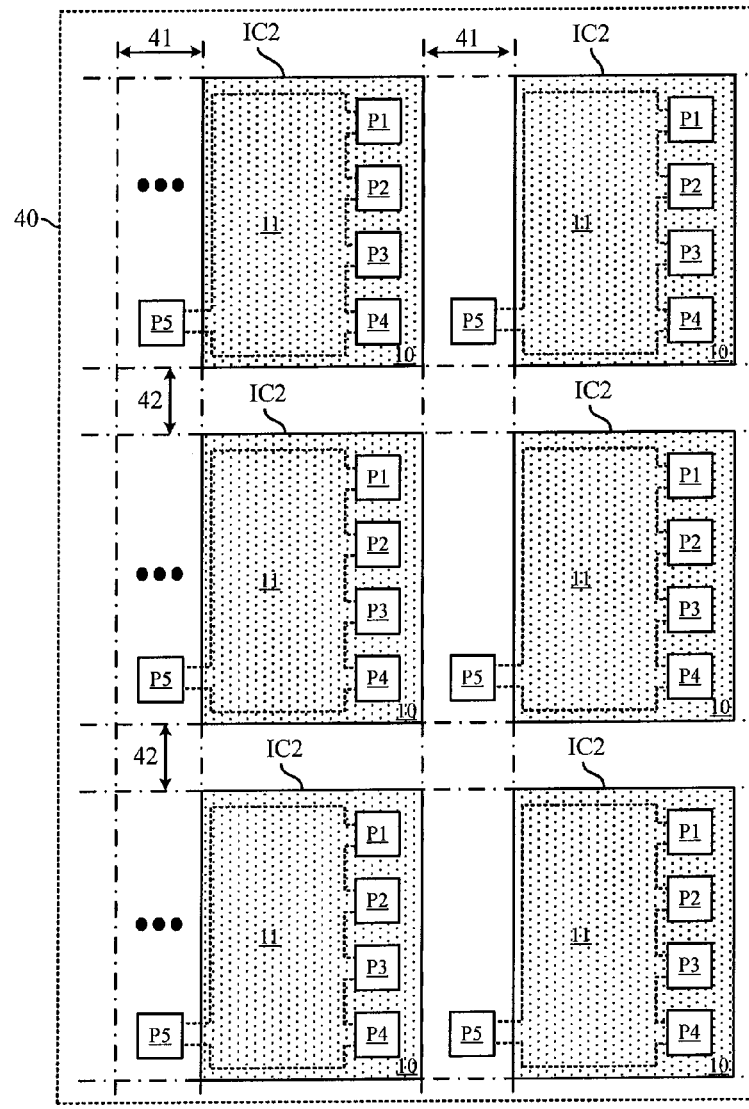
FIG. 3 is a partial top view of a semiconductor wafer according to the disclosure comprising an integrated circuit according to the disclosure, FIG. 4 schematically shows a test phase of the integrated circuit.

FIG. 3 shows a method of fabricating an integrated circuit IC2 according to the disclosure. Integrated circuit IC2 is collectively made (that is to say, in several examples) in a semiconductor wafer 40 comprising scribe lines 41, 42 separating each integrated circuit IC2. Integrated circuit IC2 comprises a semiconductor substrate 10, a circuit region 11 embedded in substrate 10 and made according to CMOS technology, and contact pads P1, P2, P3, P4, P5. Circuit region 11, schematically shown by a dashed rectangle, comprises active components such as NMOS and PMOS transistors, and may also comprise passive components such as resistors, diodes, etc. Circuit region 11 also comprises conductors extending above the active and passive components, separated by layers of dielectric material. These conductors link different parts of the circuit region and also link inputs or outputs of the circuit region to contact pads P1 to P5, the number of which depends on the number of inputs/outputs of the circuit region. Contact pads P1 to P4 extend over the front side of the wafer, not within scribe lines 41, 42. Contact pad P5 is a ground pad linked to circuit region 11 and to substrate 10, and is arranged in a scribe line 41.

Figure 1:
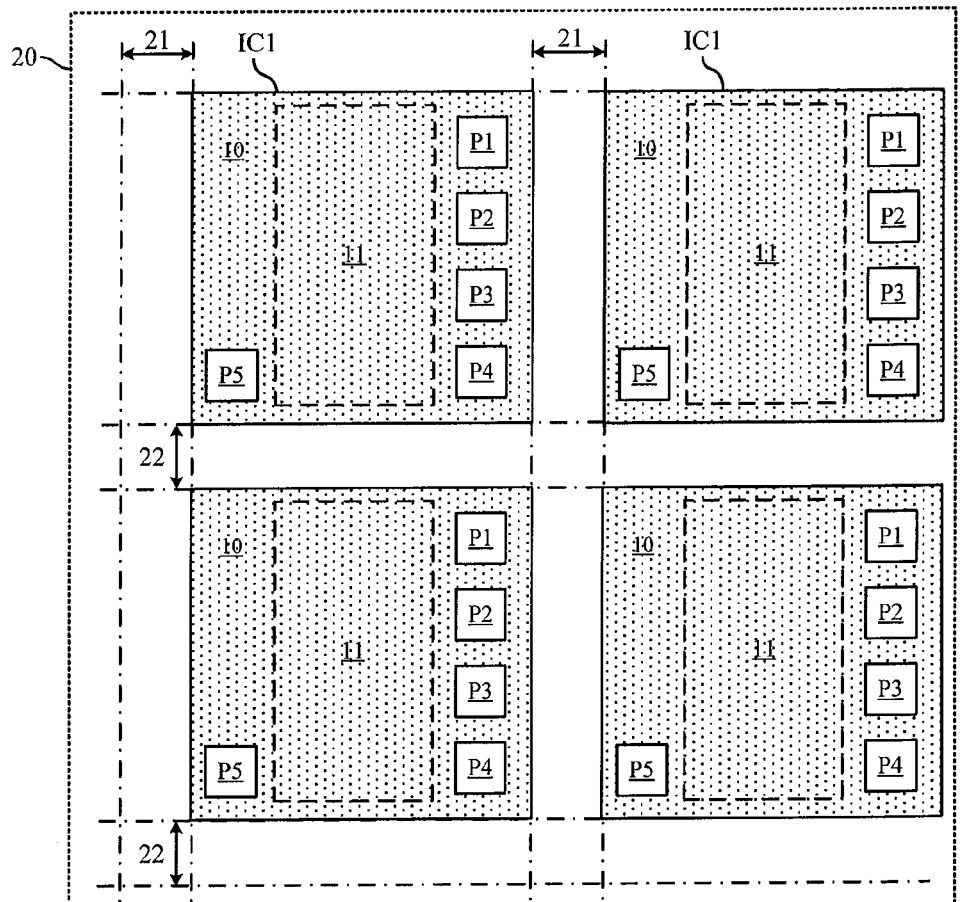
FIG. 1, previously described, is a partial top view of a conventional semiconductor wafer comprising an integrated circuit, FIG. 2, previously described, is a conventional example of assembling the integrated circuit in an interconnection package.
Figure 2:
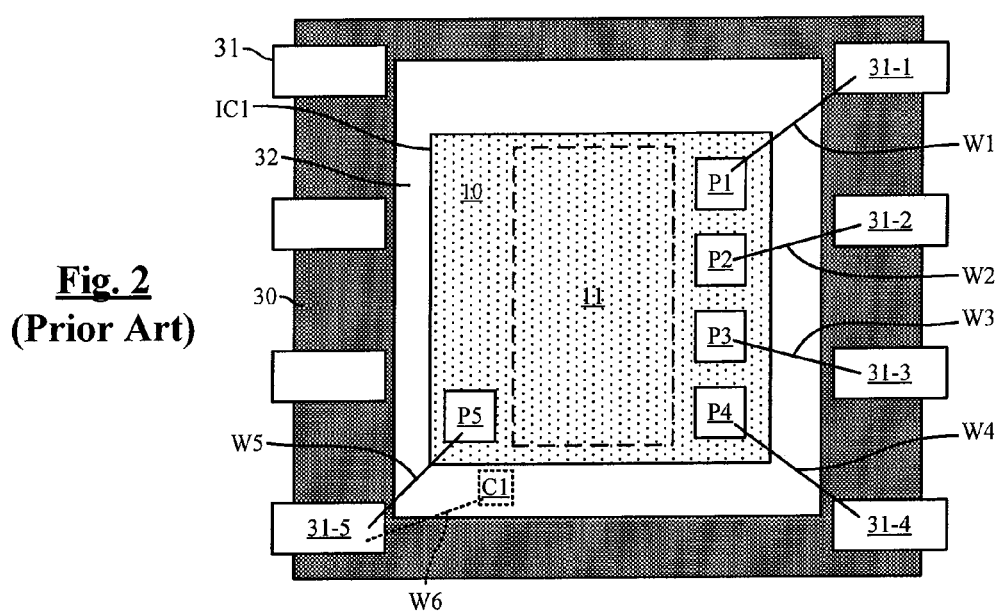

Thanks to the arrangement of the pad P5 in a scribe line, the area occupied by integrated circuit IC2 on the surface of the wafer is reduced, as may be remarked by comparing FIG. 3 to FIG. 1 (it is assumed here that integrated circuit IC2 is identical to integrated circuit IC1 of FIG. 1, besides the arrangement of pad P5). A larger number of integrated circuits IC2 may therefore be made on wafer 40, for the same wafer surface area.

Figure 4:
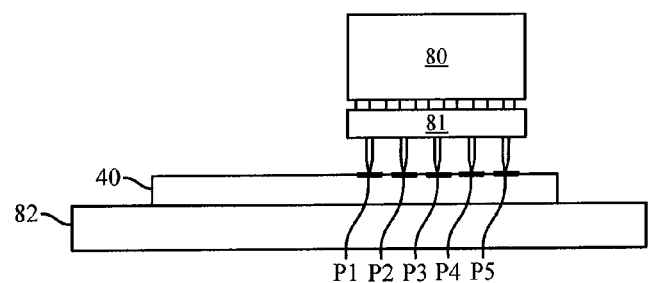

When it is completed, integrated circuit IC2 is tested in a conventional manner by means of a test machine schematically shown in FIG. 4. The test machine comprises an electrical test unit 80 coupled to a probe card 81. Card 81 comprises conductive tips or probes applied to contact pads P1 to P5. Preferably, no ground contact on the back side of the integrated circuit is linked to the test machine.

Integrated circuit IC2 is then individualized by singulation of wafer 40 in scribe lines 41, 42. The singulation of the wafer leads to the destruction of pad P5 because it is in a scribe line. The singulation of wafer 40 may be preceded by a step of thinning the wafer by mechanical and/or chemical abrasion called "backlap".

After singulation, the entire back side of integrated circuit IC2 forms a ground contact for substrate 10 and circuit region 11, as CMOS technology allows a very weak series resistance to be obtained between the substrate and the circuit region. The back side may optionally be metallized.

Figure 5:
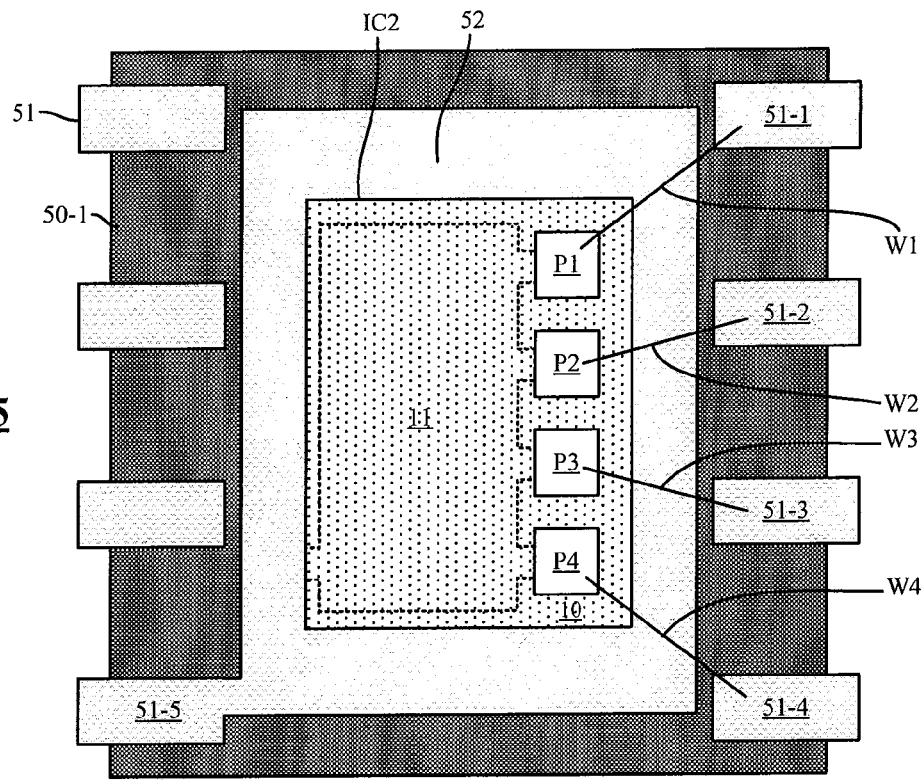
FIG. 5 shows a first example of assembling the integrated circuit according to the disclosure in an interconnection package.

Integrated circuit IC2 is then arranged in an interconnection package 50-1, as shown in FIG. 5. Package 50-1 comprises conductive leads 51 and a ground plane 52. The back side of integrated circuit IC2 is fixed on ground plane 52 by the intermediary of a conductive material of the conductive glue or solder type, and is thus in electrical contact with ground plane 52. Contact pads P1 to P4 are then connected to leads 51-1 to 51-4 of package 50 by means of conductive wires W1 to W4. Ground plane 52 extends to the exterior of the package to form a conductive lead 51-5 forming the ground lead of the package. The conductive leads 51 are destined to be soldered on an interconnection support, for example a printed circuit.

Figure 6:
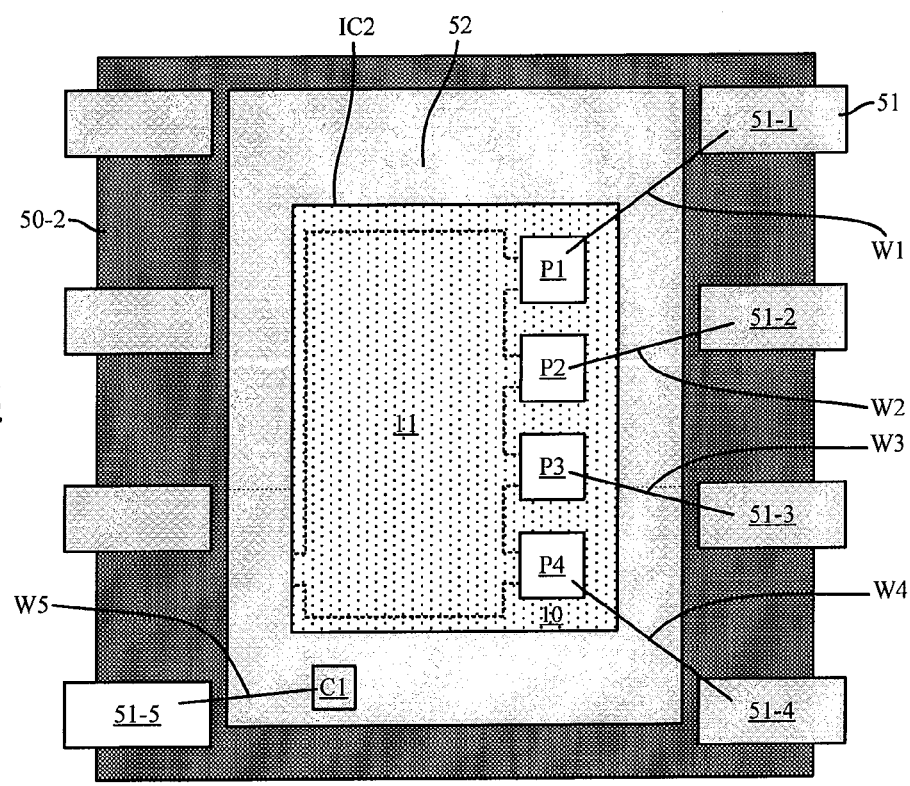
FIG. 6 shows a second example of assembling the integrated circuit according to the disclosure in an interconnection package.

In a variation 50-2 of the package shown in FIG. 6, ground lead 51-5 does not form an extension of ground plane 52 and is linked to it by means of a wire W5, the proximal extremity of which is soldered on a contact pad C1 of ground plane 52.

Figure 7:
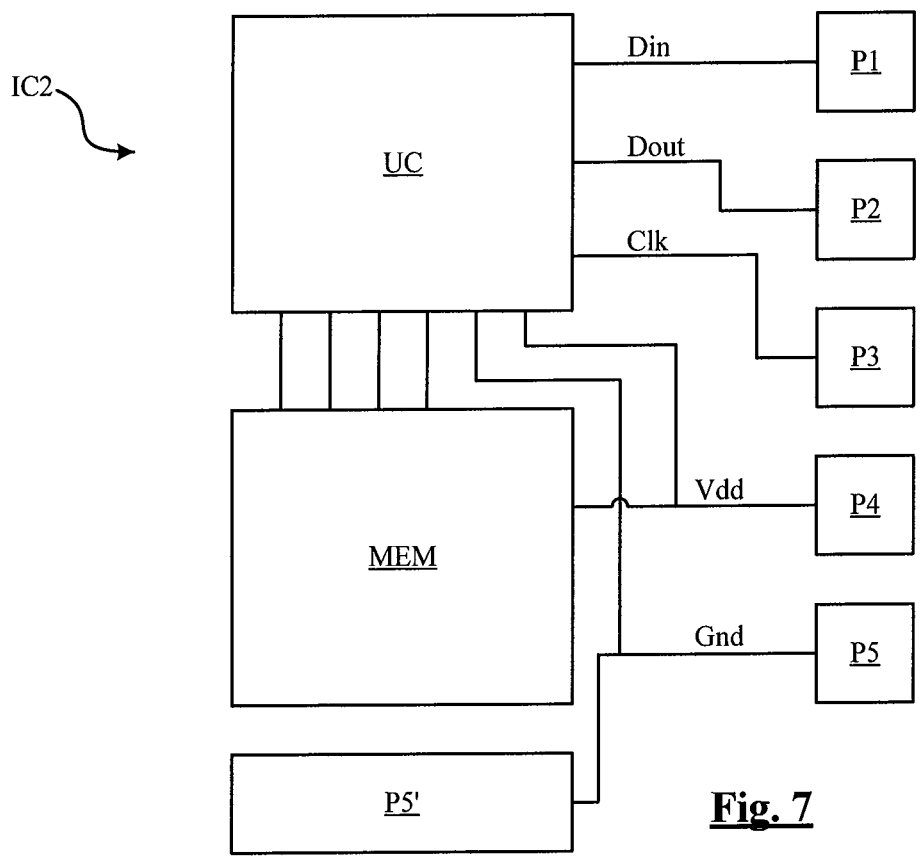
FIG. 7 shows in block form an example of a circuit region present in the integrated circuit.

The present disclosure is applicable to all types of CMOS integrated circuits. FIG. 7 schematically shows in block form an example circuit region 11 comprising a central control unit UC, of the microprocessor or hard wired type, coupled to a memory MEM. Central control unit UC is linked by conductors to pads P1 to P3 used respectively as pads for the reception of input data Din, emission of output data Dout, and reception of a clock signal Clk. Central control unit UC and memory MEM are also linked to pad P4, used as pad for the reception of an electrical supply voltage Vdd. Central control unit UC and memory MEM are also linked to pad P5 and to the ground pad on the back side of the integrated circuit, represented by reference P5'. Pad P5 is used for testing the integrated circuit from its front side. When pad P5 has been destroyed during the individualization process of the integrated circuit, only the back side contact P5' remains as a means for applying the ground potential to circuit region 11.

Figure 8:
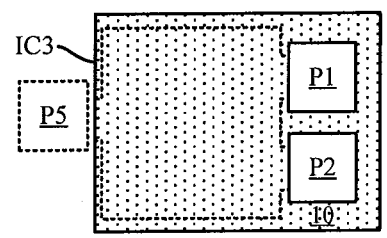
FIG. 8 shows another example of an integrated circuit according to the disclosure.

The present disclosure relates, in a general manner, to all types of CMOS integrated circuits for which it is advantageous to remove ground contact P5, for example to increase the number of integrated circuits made on a wafer. As an example, FIG. 8 shows an integrated circuit IC3 according to the disclosure, comprising only two contact pads P1, P2 ensuring both the electrical supply of the integrated circuit and the exchange of data with the exterior. It is for example an integrated circuit of the electronic tag type. It will clearly appear that the arrangement of ground pad P5 in a scribe line allows the overall size of the integrated circuit on the surface of the wafer to be reduced. In practice, the present disclosure is particularly advantageous in terms of fabrication yield when the surface area of each contact pad represents at least 5% of the surface area of circuit region 11.

Moreover, it will be noted that ground contact pad P5 is not necessarily destined to receive a zero electrical potential. As pad P5 is linked to the substrate, the potential applied to it, called "ground potential", is the electrical potential that is applied to substrate 10 and to circuit region 11 so that the integrated circuit functions properly. This ground potential may be negative or positive. For example, in a CMOS integrated circuit of the P substrate type, the P substrate receives a negative voltage. Inversely, in a CMOS integrated circuit of the N substrate type, substrate 10 receives a positive voltage.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of fabricating an electronic device, comprising:
fabricating an integrated circuit, the fabricating including:
forming scribe lines in a semiconductor wafer,
embedding a circuit region in a substrate of the wafer,
making, on a front side of the wafer, a ground contact pad of the integrated circuit that is electrically linked to the circuit region and to the substrate, wherein the ground contact pad of the integrated circuit is made in one of the scribe lines of the wafer, and
individualizing the integrated circuit by singulating the wafer in the scribe lines and destroying the ground contact pad; and
assembling the integrated circuit in a package that includes a ground plane and interconnection leads, the assembling including electrically contacting a back side of the integrated circuit with a ground interconnection lead of the package and thereby replacing the ground contact pad destroyed during individualizing the integrated circuit.

2. A method according to claim 1, wherein the ground interconnection lead forms a prolongation of the ground plane.

3. A method according to claim 1, comprising electrically linking the ground interconnection lead to the ground plane of the package using a conductive element.

4. A method according to claim 1, wherein the integrated circuit is a CMOS integrated circuit.

* * * * *